United States Patent [19]

Clawson et al.

[11] 4,086,608
[45] Apr. 25, 1978

[54] LIGHT EMITTING DIODE

[75] Inventors: Arthur R. Clawson; Herman H. Wieder, both of San Diego, Calif.

[73] Assignee: The United States of America as represented by the Secretary of the Navy, Washington, D.C.

[21] Appl. No.: 636,233

[22] Filed: Nov. 28, 1975

[51] Int. Cl.² .............................................. H01L 33/00
[52] U.S. Cl. ........................................ 357/17; 357/16
[58] Field of Search .................... 357/17, 61, 16, 30

[56] References Cited

U.S. PATENT DOCUMENTS

| 3,560,275 | 2/1971 | Kressel et al. | 357/17 |
| 3,676,228 | 7/1972 | Sakurai et al. | 357/17 X |
| 3,875,451 | 4/1975 | Bachmann et al. | 357/17 X |
| 3,982,261 | 9/1976 | Antypas | 357/16 |

FOREIGN PATENT DOCUMENTS 2,044,676  3/1972  Germany ............................. 357/17

OTHER PUBLICATIONS

B. Ross et al., "Optical Amplification of 1.06μ In $As_{1-x}P_x$ Injection-Laser Emission", IEEE J. of Quantum Electronics, vol. QE-6, No. 6, June 1970, pp. 361-366.

James et al., "Optimization of the $InAs_xP_{1-x}$-$Cs_2O$ Photocathode", J. Appl. Phys., vol. 42, No. 2, Feb. 1971, pp. 580-586.

Mabbitt et al., "High-speed high-power 1.06 μm gallium-indium-arsenide light emitting diodes", Electronic Letters, vol. 11, No. 8, pp. 157-158, Apr. 1975.

Primary Examiner—Stanley D. Miller, Jr.
Assistant Examiner—James W. Davie
Attorney, Agent, or Firm—R. S. Sciascia; G. J. Rubens; T. M. Phillips

[57] ABSTRACT

A light emitting diode with emission wavelength in the 1.06μm region suitable for use with the 1.06μm transmission window in optical fibers. The diode is fabricated by liquid phase epitaxial growth of p and n type $InAs_xP_{1-x}$ layers on InP substrates.

1 Claim, 4 Drawing Figures

LIGHT EMITTING DIODE

BACKGROUND OF THE INVENTION

The present invention relates to compositions useful in electroluminescent devices and to such devices. More particularly the present invention relates to a device of the light emitting diode type exhibiting a spectral output which can be adjusted to wavelength in the regoin of 1.06μm suitable for matching to optical fibers for communication purposes.

Light emitting diodes which emit radiation in the infrared region have been made from the materials GaAs and InP. These have been made both by liquid phase epitaxial growth and vapor phase epitaxial growth. These devices suffer from the limitations in that their emission at fixed wavelengths of 0.90 - 0.98μm are not suitable for fiber optics communication because of available optical fibers having a spectral transmission window of 1.06μm wavelength.

SUMMARY OF THE INVENTION

The present invention provides a light emitting diode when prepared as discussed herein that will emit energy with wavelength of 1.06μm, or any other wavelength in the region between the limits set by the compounds InP and InAs. Also, the InP substrate on which the diode is grown is transparent to the emitted wavelength, and thus allows transmission of the light through the substrate. The fairly small crystallagraphic mismatch (0.7% when $x = 0.2$) between the $InAs_xP_{1-x}$ film and the InP substrate allows growth of a high quality film with few crystal defects in the region of the p-n junction, thus allowing efficient light conversion.

Accordingly, an object of the invention is to provide a light emitting diode which will emit at a wavelength compatible with the transmission window of available optical fibers.

Another object is the provision of a light emitting diode with a spectral output of 1.06μm wavelength.

Other objects and many of the attendant advantages of this invention will be readily appreciated as the same becomes better understood by reference to the following detailed description when considered in connection with the accompanying drawings.

DESCRIPTION OF THE PREFERRED EMBODIMENTS

With reference now to the growth process, the first step involves preparing a melt comprising InAs and P together with any desired dopant. In accordance with the present invention it has been determined that compositions in the InAsP system evidence ample photoluminescence properties and emit light in the infrared portion of the spectrum when the value of $x$ in the general formula $InAs_xP_{1-x}$ ranges from 0.00 to 0.2.

The required charge including InAs and P and any desired dopants for the purpose of forming either a P or N type of material is then placed in a graphite or boron nitrate boat or other suitable vessel. For the purposes of the present invention it has been found suitable to use a boat configuration including at least one well (in which there is formed a source solution) and a sliding substrate holder which is capable of depositing the substrate member and the well upon tipping of the apparatus in accordance with the conventional solution epitaxy techniques. The specific apparatus employed in accordance with the invention also permits the use of a technique which assures saturation of the source solution during the course of the growth process, by providing a quantity of InP in excess of the amount necessary for saturation of the melt. This results in solid InP floating on the top of the melt during the growth. This provides assurance that the melt is saturated with phosphorus.

Substrate member suitable for use in the practice of the present invention are selected from among those semi-conductive materials evidencing a lattice constant with less than a 0.7% of the lattice constant of $InAs_xP_{1-x}$. Materials found particularly useful for this purpose are $InAs_xP_{1-x}$, etc. It has been found desirable to initially deposit a film of $InAs_xP_{1-x}$ doped with Sn upon an InP substrate in such a manner as to result in a match in lattice constants between the materials with a mismatch of less than 0.7% when $X = 0.04$ and continue disposition thereon of $InAs_xP_{1-x}$ until $X = 0.05$. Then in a separate run an $InAs_xP_{1-x}$ layer doped with zinc is deposited on the $InAs_xP_{1-x}$ layer in such a manner as to result in a substantial match in the lattice constants between the materials.

Figure 1:
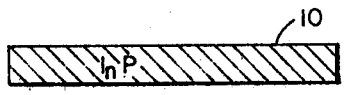
FIGS. 1 through 4 are cross-sectional views in successive stages of manufacture of an electroluminescent junction device of the present invention.
Figure 2:
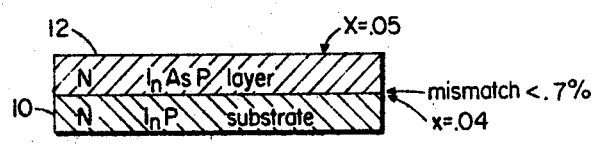
Figure 3:
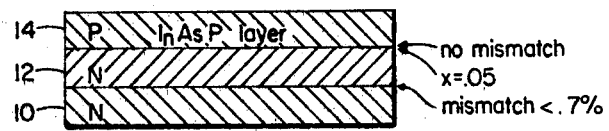

Referring now to the drawing there is shown in FIG. 1 a substrate of indium phosphide. FIG. 2 shows an N-type crystal 10 of $InAs_xP_{1-x}$ doped with Sn which has a mismatch between the substrate 10 and the N-type crystal 12 with a mismatch of less than 0.7%.

Figure 4:
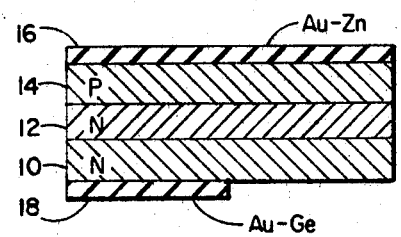

In FIG. 4 a P-type crystal of $InAs_xP_{1-x}$ doped with zinc is deposited on the N-type crystal 12 and with a lattice match between the P-N laygers when $x = 0.05$. In FIG. 4 an ohmic contact of gold-zinc is vacuum deposited on the P layer 14 and a gold-germanium is vacuum deposited over a portion of the substrate 10 to provide a good contact but at the same time to permit infrared energy emitted by the PN junction to be transmitted through the transparent substrate 10.

An example of an application of the present invention is set forth below. It is intended merely as an illustration and it is to be appreciated that the method described may be varied by one skilled in the art without departing from the spirit and scope of the invention.

EXAMPLE

An $InAs_xP_{1-x}$ crystal and electroluminescent junction device were prepared as follows:

876mg, 67In, 21mg InAs, 32mg InP and 1.4mg Sn were placed in the well of a graphite boat of the type alluded to above, the well of said boat having positioned therein a wafer of Sn-doped ($\bar{1}\ \bar{1}\ \bar{1}$) InP with a donor density of $5 \times 10^{17cm-3}$. The surface was polished-etched in 1% Br/methanol immediately before use. The substrate area (4.2mm × 7.1mm) is smaller than the melt area (6.5mm × 9.5mm) to provide better uniformity of the film thickness. The graphite boat was inserted in a quartz tube in the system flushed with hydrogen. Thereafter the quartz tube was inserted in an oven and heated in a 5-minute warm-up of the melt only from room temperature to 733° C, followed by moving the furnace over the substrate. Two and one-half minute warm-up to 744° C to dissolve more phosphorus in a shorter time. Six-minute cool down to 730° C to provide a melt that is super saturated followed by introduction of the substrate to the melt. Two and one-half minute warm-up to 734° C to melt-back the substrate surface.

Growth of the film from 734° C to 710° C at a cooling rate of 1.7° C/minute followed by removal of the substrate from the melt. Next the furnace was removed to rapidly cool the film to room temperature.

The P-layer was grown in a separate run, with the furnace opened only long enough to insert a new melt. The P-layer melt composition was 1031mg 69In, 26mg InAs, 45mg InP and 1.8mg zinc. The quantity of zinc is far in excess of the amount necessary, however the serious loss of zinc by evaporation during the growth run required this amount. The growth of the P layer is as follows, 3½ minute warm-up of the melt only from room temperature to 739° C, followed by moving the furnace over the substrate, 2-minute period at 739° C, 3½ minute cool-down to 729° C, followed by introduction of the substrate and N-layer film to the melt. Two-minute warm-up to 734° C to melt-back the surface of the N-layer. Growth of the film from 734° to 710° C at a cooling rate of 1.7° C/minute followed by removal of the substrate from the melt. Removal of the furnace to rapidly cool the film to room temperature. The film surface was free from any major carry over of solvent, however it was subjected to ultrasonic agitation in a solution of mercurichloride in dimethyl formamide (mixed 100 grams $HgCl_2$ per pint of DMF)(to remove any free In that might be present. This was followed by light etch in Br/methanol, then evaporation of gold-alloy contacts. The P-layer contact 16 was 0.1 zinc-.99 gold approximately 2000A. The N-layer substrate contact 18 was gold-germanium evtectic approximately 2000A thick. The contacts were used as evaporated without alloying with the semiconductor. Individual diodes with edges approximately 0.5mm × 0.8mm were cut with a wire saw. The diodes were mounted with the substrate side soldered to TO-3 headers. The lead to the P-layer was epoxied to the zinc/gold contact. Quantative evaluation of the diodes was carried out with infrared image converter. Light emission was from the edges of the die, however, it was not restricted to the junction only but was transmitted through the InP substrate also.

In order to demonstrate the efficiency of the device, the device was connected to a D.C. source under forward bias conditions, the + to the P-region and the − to the N-region. At room temperature, at voltages ranging from 0.9 to 1.1 volts the device was found to emit light in the range from 0.92 to 1.1μm.

Obviously many modifications and variations of the present invention are possible in the light of the above teachings. It is therefore to be understood that within the scope of the appended claims the invention may be practiced otherwise than as specifically described.

What is claimed is:

1. A light emitting diode capable of emitting light in the infrared portion of the spectrum and at room temperature comprising:
    (a) an N doped InP substrate,
    (b) an N doped epitaxial layer of $InAs_xP_{1-x}$ deposed on said substrate, said N doped epitaxial layer having a first surface in contact with said substrate and a second surface opposite said first surface with $x$ ranging in value from 0.04 at said first surface to 0.05 at said second surface and said substrate and said N doped layer having lattice constants with a mismatch of less than 0.7%,
    (c) a P doped epitaxial layer of $InAs_xP_{1-x}$ deposed on said N doped layer with $x$ having a value of 0.05 said N doped layer and said P doped layer having substantially identical lattice constants, and
    (d) a conductive ohmic contact material on the surface of said P doped layer,
    (e) a conductive ohmic contact material on the exterior surface of said substrate,
    (f) whereby at room temperature and with a voltage applied across said ohmic contacts that ranges from 0.9 to 1.1 volts, said diode will emit light in the range from 0.92 to 1.1μm.

* * * * *